(12) United States Patent
Shao et al.

(10) Patent No.: US 12,374,549 B2
(45) Date of Patent: Jul. 29, 2025

(54) METHOD OF FORMING SEMICONDUCTOR STRUCTURE

(71) Applicant: Winbond Electronics Corp., Taichung (TW)

(72) Inventors: Po-Chun Shao, Hsinchu (TW); Shih-Hsien Chen, Taichung (TW); Ping-Lung Yu, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 386 days.

(21) Appl. No.: 17/901,525

(22) Filed: Sep. 1, 2022

(65) Prior Publication Data
US 2023/0230835 A1 Jul. 20, 2023

(30) Foreign Application Priority Data
Jan. 19, 2022 (TW) .................................. 111102129

(51) Int. Cl.
*H01L 21/00* (2006.01)
*H01L 21/033* (2006.01)
*H01L 21/3115* (2006.01)
*H01L 21/3213* (2006.01)

(52) U.S. Cl.
CPC .... *H01L 21/0337* (2013.01); *H01L 21/31155* (2013.01); *H01L 21/32139* (2013.01)

(58) Field of Classification Search
CPC ........... H01L 21/0337; H01L 21/31155; H01L 21/3146; H01L 21/32
See application file for complete search history.

(56) References Cited

U.S. PATENT DOCUMENTS

| | | | |
|---|---|---|---|
| 8,623,770 B1 * | 1/2014 | Gao | H01L 21/0337 438/785 |
| 8,936,988 B2 | 1/2015 | Yin et al. | |
| 2008/0303094 A1 * | 12/2008 | Rao | H10D 30/6893 257/E29.264 |
| 2014/0367833 A1 * | 12/2014 | Brink | H01L 21/0338 257/618 |
| 2018/0240667 A1 * | 8/2018 | Yu | H01L 21/31138 |
| 2019/0172714 A1 * | 6/2019 | Bobek | H01L 21/0335 |

FOREIGN PATENT DOCUMENTS

| | | |
|---|---|---|
| CN | 104143534 B | 5/2018 |
| TW | 202022149 A | 6/2020 |
| TW | 202117051 A | 5/2021 |

OTHER PUBLICATIONS

"Aspect ratio (image)." Wikipedia, Wikimedia Foundation, Jan. 3, 2025, https://en.wikipedia.org/wiki/Aspect_ratio_(image). Feb. 4, 2025. (Year: 2025).*

(Continued)

*Primary Examiner* — Reema Patel
(74) *Attorney, Agent, or Firm* — MUNCY, GEISSLER, OLDS & LOWE, P.C.

(57) ABSTRACT

A semiconductor structure is provided. The semiconductor structure includes a substrate, a target layer on the substrate, and a hard mask layer doped with a group IV-A element on the target layer. The number of sp3 orbital bonds in the hard mask layer is greater than the number of sp2 orbital bonds.

16 Claims, 6 Drawing Sheets

(56) References Cited

OTHER PUBLICATIONS

D. Johnston. Hybridization—Carbon. http://faculty.otterbein.edu/DJohnston/chem220/tutorial1/carbon.html#:~:text=Hybridization%20%2D%20Carbon,-Carbon%20%2D%20sp3&text=A%20carbon%20atom%20bound%20to,one%20sp3%20carbon%20atom. (Year: 2025).*

B. Bhattacharyya. "High Aspect Ratio Microstructures." Electrochemical Micromachining for Nanofabrication, MEMS and Nanotechnology, 2015. https://www.sciencedirect.com/topics/engineering/high-aspect-ratio-microstructures. Feb. 4, 2025. (Year: 2025).*

* cited by examiner

METHOD OF FORMING SEMICONDUCTOR STRUCTURE

CROSS REFERENCE TO RELATED APPLICATIONS

This application claims priority of Taiwan Patent Application No. 111102129 filed on Jan. 19, 2022, the entirety of which are incorporated by reference herein.

BACKGROUND

Technical Field

The present disclosure relates to a semiconductor structure, and in particular, to a semiconductor structure having a hard mask layer doped with Group IV-A elements and a method of forming the same.

Description of the Related Art

Semiconductor devices are widely used in various fields, such as automotive electronics, industrial electronics, communications, computer computing, and consumer electronics. In order to increase the component density of semiconductor devices and improve their performance, existing techniques of memory device fabrication continue to strive in scaling down the sizes of the components. However, as the sizes of the components continue to be scaling down, the challenge of their fabrication are also increased.

Although existing various masks have been generally adequate for their intended purposes, they have not been entirely satisfactory in all respects. Therefore, it is still necessary to improve the masks and method of forming thereof to overcome the problems caused by scaling down so as to improve reliability and performance of the device.

BRIEF SUMMARY

An embodiment of the present disclosure provides a semiconductor structure including a substrate, a target layer, and a hard mask layer doped with a first IV-A element. The target layer is on the substrate. The hard mask layer is on the target layer.

In some embodiments, the hard mask layer includes a second IV-A element, wherein the second IV-A element is different from the first IV-A element. In some embodiments, a number of sp3 orbital bonds is greater than a number of sp2 orbital bonds of the first IV-A element doped in the hard mask layer. In some embodiments, a ratio of a number of sp3 orbital bonds to a number of sp2 orbital bonds of the first IV-A element doped in the hard mask layer is 2.5-4.0. In some embodiments, the hard mask layer includes a diamond-like carbon (DLC) layer and the first IV-A element is carbon. In some embodiments, a compressive stress of the hard mask layer doped with the first IV-A element is about-100 MPa to about 100 MPa.

An embodiment of the present disclosure provides a method for forming a semiconductor structure including: providing a substrate; forming a target layer on the substrate; forming a hard mask layer on the target layer; and implanting IV-A elements into the hard mask layer to increase a number of sp2 orbital bonds in the hard mask layer. In some embodiments, after implanting the hard mask layer with the IV-A elements, the ratio of the number of sp3 orbital bonds to the number of sp2 orbital bonds in the hard mask layer changes from greater than 4 to between 2.5 and 4.0, and the stress of the hard mask layer may be reduced from between −1500 MPa and −500 MPa to between −100 MPa and 0 MPa.

In some embodiments, the hard mask layer includes a diamond-like carbon (DLC) layer, and the IV-A elements are carbon. In some embodiments, implanting the hard mask layer with the IV-A elements is performed by an ex-situ implantation method. In some embodiments, the method further includes: patterning the hard mask layer to expose the target layer; forming a plurality of spacers on sidewalls of the patterned hard mask layer; and removing the hard mask layer.

DETAILED DESCRIPTION

Figure 1:
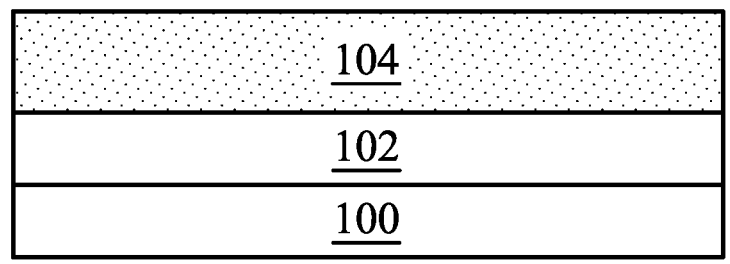
FIGS. 1, 2, and 3 illustrate cross-sectional views of a semiconductor structure, according to some embodiments of the present disclosure.

FIG. 1 illustrates a cross-sectional view of a semiconductor structure according to some embodiments of the present disclosure. The semiconductor structure 10 includes a substrate 100, a target layer 102, and a hard mask layer 104.

According to some embodiments, the target layer 102 is disposed on the substrate 100. The target layer may include active components, passive components, dummy components, a portion of the foregoing components, or combination thereof. In some embodiments, the target layer 102 includes one or more mask layers. In some embodiments, the target layer 102 includes conductive components. In some embodiments, the target layer 102 includes an active region or an active layer. In some embodiments, the target layer 102 includes a dielectric layer, such as an oxide layer, a nitride layer, a low-k material layer, a photoresist layer, or a semiconductor layer (e.g., a poly silicon layer).

In general, in order to pattern the target layer and/or protect the target layer in subsequent processes, a hard mask layer may be formed on the target layer. A hard mask layer with specific properties may be chosen to be formed depending on various requirements of the target layer, the patterning process, and/or the subsequent processes. Referring to FIG. 1, a doped hard mask layer 104 is disposed on the target layer 102. According to some embodiments, the hard mask layer 104 includes a carbon layer, a semiconductor layer, or a layer of other suitable materials. In some embodiments, the hard mask layer 104 is doped with a group IV-A element, the crystal structure of the surface of the hard mask layer is first converted into an amorphous structure, and the sp3 orbital bonds are broken into sp2 orbital bonds, so as to reduce the stress of the hard mask layer 104. At the same time, the local heating phenomenon in the ion implantation process makes the sp2 orbital bonds re-bond into sp3 orbital bonds in the local area.

However, the number of sp3 orbital bonds is still greater than the number of sp2 orbital bonds in the hard mask layer 104, to maintain its etching resistance. This can effectively reduce the stress in the hard mask layer 104, thereby avoiding a de-bonding of the hard mask layer 104 form other layers (for example, the target layer 102 or a layer subsequently formed on the hard mask layer 104), to improve reliability and stability of the semiconductor structures. In some embodiments, the ratio (sp3/sp2) of the number of sp3 orbital bonds to the number of sp2 orbital bonds in hard mask layer 104 doped with the group IV-A element doped is 2.5 to 4.0, for example, 3.3 or 3.7. In contrast, the ratio (sp3/sp2) of the number of sp3 orbital bonds to the number of sp2 orbital bonds in the undoped hard mask layer is greater than 4.

In some embodiments, the doping concentration of the group IV-A element is $10^{10}$ cm$^{-3}$ to $10^{20}$ cm$^{-3}$, which may effectively reduce the stress in the hard mask layer 104 and maintain the etching resistance of the hard mask layer 104. For example, in some embodiments, the hard mask layer 104 doped with Group IV-A element may reduce its compressive stress by more than absolute value of 90%, while maintaining the etching resistance of the hard mask layer 104 to avoid de-bonding from the layers and cracking and/or bending of the layers. In addition, the hard mask layer 104 may still protect the target layer 102 in the subsequent patterning process. Therefore, the embodiments of the present disclosure are particularly advantageous for etching processes that etch a thick hard mask layer with an aspect ratio (width to height) in the range of 1:1 to 1:200, where the thickness of the hard mask layer is about 1 nm to 1 μm, or thicker.

According to some embodiments of the present disclosure, the material of forming the hard mask layer 104 includes a group IV-A element. In addition, the material of the hard mask layer 104 includes a group IV-A element used for doping into the hard mask layer 104. In some embodiments, the material for forming the hard mask layer 104 is the same as the group IV-A element used for doping into the hard mask layer 104, such that no additional process is needed in a subsequent patterning process or a removing process. In other embodiments, since the hard mask layer 104 includes the same material as the group IV-A element used for doping the hard mask layer 104, the contamination problems of the process or equipment may be avoided. According to some embodiments, the thickness of the hard mask layer 104 is 1 nm to 1 μm or greater.

In some embodiments, the hard mask layer 104 is a diamond-like carbon (DLC) layer, and the group IV-A element used to be doped into the diamond carbon layer is carbon. In other embodiments, the hard mask layer 104 includes a semiconductor layer, for example, an elemental semiconductor layer (e.g., a silicon layer or a germanium layer), a binary compound semiconductor layer (e.g., a silicon germanium (SiGe) layer, a germanium carbon (GeC) layer, and a silicon carbon (SiC) layer), a combination thereof, or other suitable semiconductor layers.

Figure 2:
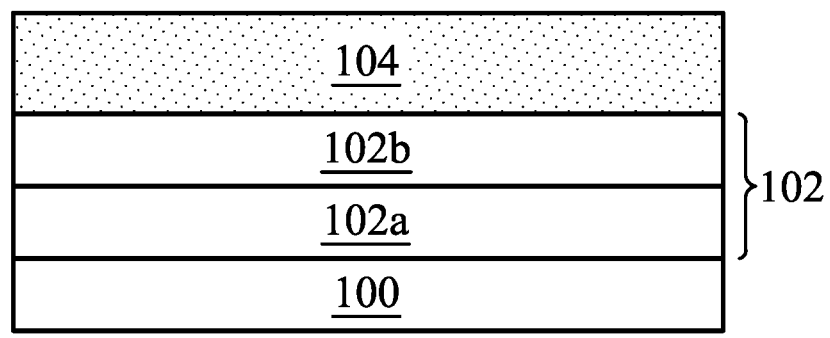

FIG. 2 illustrates a cross-sectional view of a semiconductor structure, according to other embodiments of the present disclosure. The semiconductor structure 10 includes a substrate 100, a target layer 102, and a doped hard mask layer 104. As shown in FIG. 2, the target layer 102 includes a first mask layer 102a and a second mask layer 102b. In some embodiments, each of the first mask layer 102a and the second mask layer 102b may include an amorphous carbon layer, a silicon-rich carbon layer, a polysilicon layer, a silicon oxide layer, a silicon nitride layer, a silicon oxynitride layer, a photoresist layer, or a combination thereof. In some embodiments, a dual patterning process or a damascene process for forming a conductive contact feature is performed to the target layer 102 which is formed of the first mask layer 102a and the second mask layer 102b of the semiconductor structure 10 to form an active region of a memory device. In some embodiments, where the hard mask layer 104, the first mask layer 102a, and the second mask layer 102b include the same material, the crystal structure of the hard mask layer 104 is different from that of the first mask layer 102a, and the crystal structure of the hard mask layer 104 is also different from that of the second mask layer 102b.

Figure 3:
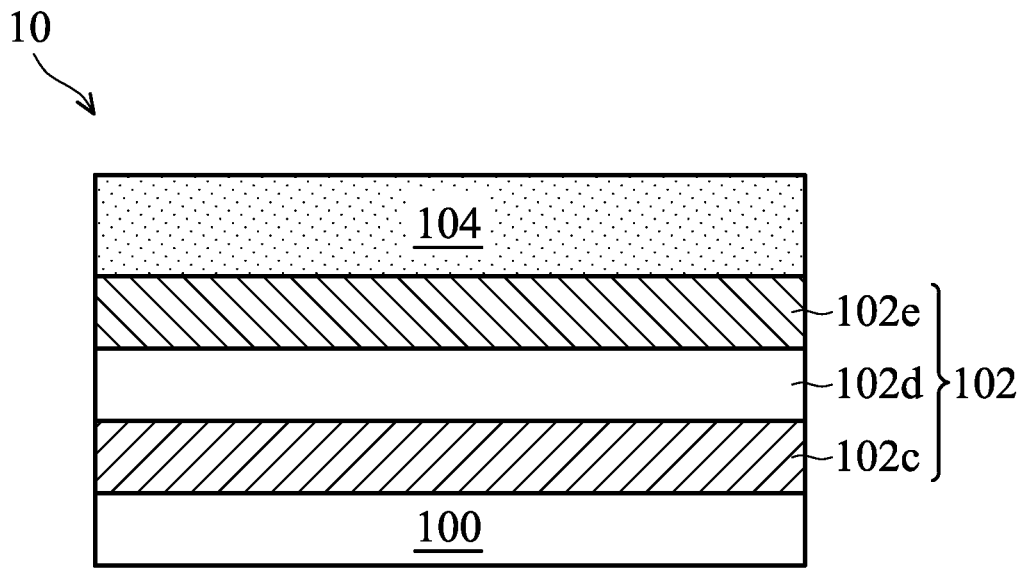

FIG. 3 illustrates a cross-sectional view of a semiconductor structure, according to other embodiments of the present disclosure. The semiconductor structure 10 includes a substrate 100, a target layer 102, and a doped hard mask layer 104. In the embodiment as shown in FIG. 3, the target layer 102 includes a gate stack layer including a floating gate layer 102c, an inter-gate dielectric layer 102d on the floating gate layer 102c, and a control gate layer 102e on the inter-gate dielectric layer 102d. In these embodiments, the doped hard mask layer 104 may be used as an etch mask in the subsequent patterning process. Since (the absolute value of) the compressive stress of the doped hard mask layer 104 is smaller, it can prevent the layer from cracking, bending and/or de-bonding from the doped hard mask layer 104.

According to some embodiments of the present disclosure, each of the floating gate layer 102c and the control gate layer 102e may include a metal layer, a metal nitride layer, a polysilicon layer, or a combination thereof, respectively. According to some embodiments, the material of the inter-gate dielectric layer 102d may include silicon oxide, silicon nitride, silicon oxynitride, or a high-k (dielectric constant greater than 3.9) dielectric material. In some embodiments, the inter-gate dielectric layer 102d is a single layer structure formed of silicon oxide. In other embodiments, the inter-gate dielectric layer 102d is a multi-layer structure including silicon oxide, silicon nitride, and other high-k dielectric materials.

Figure 4:
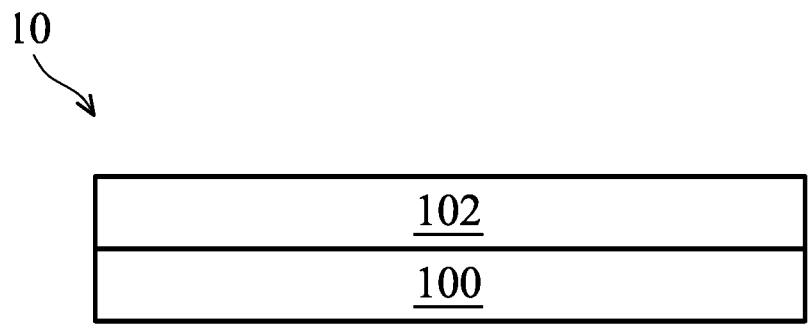
FIGS. 4 and 5 illustrate cross-sectional views of a semiconductor structure during manufacturing processes, according to some embodiments of the present disclosure.
Figure 5:
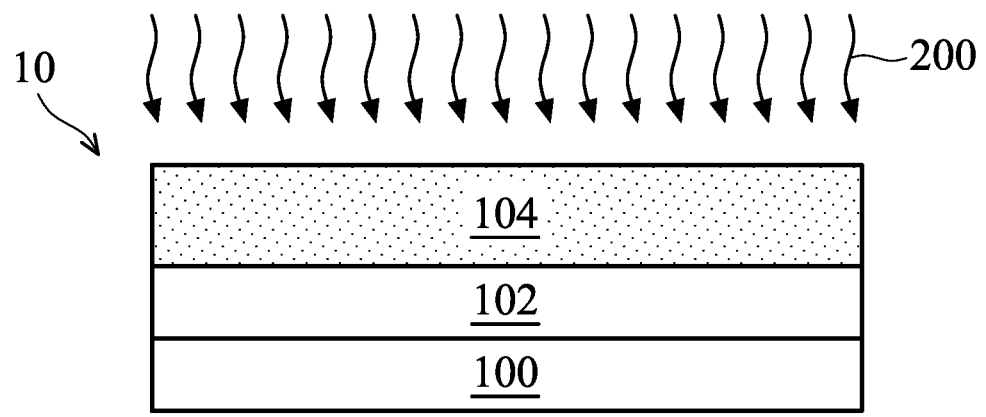

The formation and doping of the hard mask layer in the embodiments of the present disclosure are described below in conjunction with the cross-sectional views during manufacturing processes as shown in FIGS. 4-5. Referring to FIG. 4, a substrate 100 is provided. Next, a target layer 102 is formed on the substrate 100. In some embodiments, the target layer 102 includes one or more mask layers, which may include an amorphous carbon layer, a silicon-rich carbon layer, a polysilicon layer, a silicon oxide layer, a silicon nitride layer, a silicon oxynitride layer, a photoresist layer, or a combination thereof.

In some embodiments, the target layer 102 includes a gate stack, and the gate stack includes a floating gate layer, a control gate layer, and an inter-gate dielectric layer between the floating gate layer and the control gate layer. In some embodiments, each of the floating gate layer and the control gate layer may include a metal layer, a metal nitride layer, a polysilicon layer, or a combination thereof, respectively. In some embodiments, the material of the inter-gate dielectric layer may include oxide, nitride, oxynitride, or high-k (dielectric constant greater than 3.9) dielectric material.

Referring to FIG. 5, a hard mask layer 104 is formed on the target layer 102. The hard mask layer 104 includes a carbon-containing layer, a carbon layer, a semiconductor layer, or a layer formed of other suitable materials according to some embodiments. Still referring to FIG. 5, the implantation process 200 is then performed, and the hard mask layer 104 is implanted with IV-A elements, and the sp3 orbital bonds may be broken into sp2 orbital bonds first, to reduce the stress of the layer. In the meanwhile, the local heating phenomenon generated by the ion implantation process makes the sp2 orbital bonds in the local area re-bond to sp3 orbital bonds. In some embodiments, implanting the hard mask layer 104 with the group IV-A element may cause damage to part of the crystal structure in the hard mask layer 104 (e.g., the crystal structure of the surface/near the surface of the hard mask layer 104), converting it to into an amorphous structure. For example, according to some embodiments, during the implantation process 200, the group IV-A element breaks a portion of the sp3 orbital bonds in the hard mask layer 104, converting the portion of the sp3 orbital bonds into sp2 orbital bonds. This may achieve stress relief in the hard mask layer 104, thereby avoiding the de-bonding of the hard mask layer 104 from other layers, the de-bonding between other layers, or cracking and/or bending in other layers, to improve reliability and stability of the semiconductor structure.

According to some embodiments, after the implantation process 200 is performed, the ratio of the number of sp3 orbital bonds to the number of sp2 orbital bonds in the hard mask layer 104 is reduced from greater than 4 to a range about 2.5-4.0. For example, the ratio of the number of sp3 orbital bonds to the number of sp2 orbital bonds in the hard mask layer 104 may be 2.7, 3.3 or 3.7. According to some embodiments, if the ratio of the number of sp3 orbital bonds to the number of sp2 orbital bonds in the hard mask layer 104 is less than 2.5, this indicates that the number of broken sp3 orbital bonds is too high. The characteristics of the hard mask layer 104 may change, and the etching resistance of the hard mask layer 104 may decrease. If the ratio of the number of sp3 orbital bonds to the number of sp2 orbital bonds in the hard mask layer 104 is greater than 4.0, this indicates that the number of broken sp3 orbital bonds is not sufficient to effectively relieve the stress of the hard mask layer 104. It should be noted that the heat generated by the implantation process may convert the sp2 orbital bonds into sp3 orbital bonds in the hard mask layer, however the number of sp3 orbital bonds converted into sp2 orbital bonds is still higher than the number of sp2 orbital bonds converted into sp3 orbital bonds.

According to some embodiments, the hard mask layer 104 includes the group IV-A element used in the implantation process 200. In some embodiments, the hard mask layer 104 is composed of the group IV-A element used in the implant process 200. In some embodiments, the hard mask layer 104 is implanted with the group IV-A element by using an ex-situ implantation method.

In some embodiments, the compressive stress of the hard mask layer 104 implanted with the group IV-A element is in a range of −100 MPa to 100 MPa. For example, it may be −74 MPa or −40 MPa. In some embodiments, the implantation concentration of the IV-A element is in a range of $10^{10}$ $cm^{-3}$ to $10^{20}$ $cm^{-3}$. For example, it may be $5×10^{10}$ $cm^{-3}$, $7×10^{12}$ $cm^{-3}$, $1.3×10^{15}$ $cm^{-3}$, $2×10^{17}$ $cm^{-3}$, or $3×10^{19}$ $cm^{-3}$. According to some embodiments, if the implantation concentration of the group IV-A element is greater than $1×10^{20}$ $cm^{-3}$, it may cause too many sp3 orbital bonds to be converted into sp2 orbital bonds, and the etching resistance of the hard mask layer 104 doped with the group IV-A element may decrease. If the implantation concentration of the group IV-A element is less than $1×10^{10}$ $cm^{-3}$, only a small number of sp3 orbital bonds may be converted into sp2 orbital bonds, and the stress may not be effectively reduced. In some embodiments, the implantation energy of the Group IV-A element is in a range of 100 eV to 10 MeV. For example, it may be 35 keV, 900 keV, or 7 MeV. According to some embodiments, if the implantation energy of the group IV-A element is greater than 10 MeV, too many sp3 orbital bonds may be broken and the physical and/or chemical properties of the hard mask layer 104 may change, causing damage in the subsequent process, or to the resulting semiconductor structure. If the implantation energy of the group IV-A element is less than 100 eV, it may not be sufficient to break the sp3 orbital bonds, or only a small number of sp3 orbital bonds may be broken, and the stress may not be effectively reduced.

According to some embodiments, other parameters, such as the thickness of the hard mask layer 104 or other conditions in the doping process, may be adjusted to reduce the stress and maintain the etching resistance. In some embodiments, after doping the group IV-A element, the compressive stress of the hard mask layer 104 changes from about −1000 MPa (before doping) to between −100 MPa and 100 MPa (after doping). In some embodiments, the hard mask layer 104 is a DLC layer, and the group IV-A element used in the implantation process 200 is carbon. According to some embodiments, the DLC layer doped with carbon may reduce the compressive stress less than absolute value of 10% of the DLC layer (before implantation). In addition, the etching resistance of the DLC layer doped with carbon may maintain the etching resistance of 85% to 100% of the DLC layer (before implantation). For example, in one embodiment, the compressive stress of the DLC layer is about-1000 MPa, after the carbon implantation process, the compressive stress of the implanted DLC layer doped with carbon is in a range about-100 MPa to about 100 MPa. In addition, the implanted DLC layer still has the ability to resist the etching in the subsequent process. According to some embodiments, the DLC layer has a thickness of 1 nm to 1 μm, for example, 160 nm, 300 nm, or 500 nm. In some embodiments, the DLC layer may be formed by using sputtering, ion beam assisted deposition, arc evaporation, or other suitable physical vapor deposition methods.

For example, in an anisotropic etching process for thickness etching, the etching time to etch through the carbon-doped DLC layer is twice that of other carbon-containing material layer (e.g., an amorphous carbon layer) under the same initial thickness and the same etching conditions. In another example, in an anisotropic etching process for thickness etching, the thickness removed by etching of carbon-containing material layers other than the carbon-doped DLC layer is twice or more than that of the carbon-doped DLC layer under the condition of the same etching time and the same etching conditions.

Figure 6:
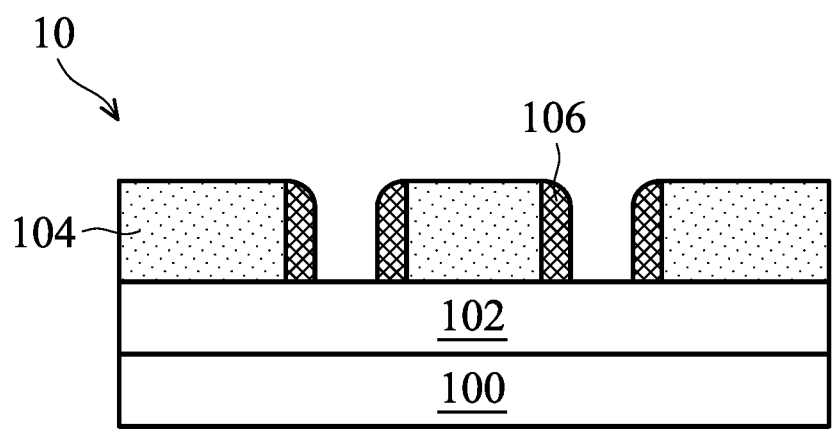
FIGS. 6, 7, and 8 illustrate cross-sectional views of a semiconductor structure during manufacturing processes, according to other embodiments of the present disclosure.
Figure 7:
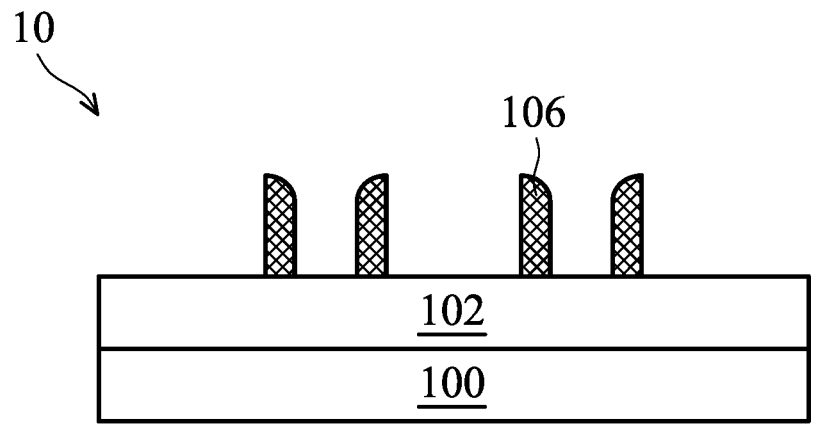

FIGS. 6-7 illustrate the applications of the hard mask layer of the present disclosure in the manufacturing process according to some embodiments of the present disclosure. Referring to FIG. 6, according to some embodiments, after the semiconductor structure 10 as shown in FIG. 5 is formed, the hard mask layer 104 is patterned to expose the target layer 102.

Then, spacers 106 are formed on the sidewalls of the patterned hard mask layer 104. In some embodiments, the material of the spacer 106 may include oxide, nitride, oxynitride, or a combination of thereof. In some embodiments, the step of forming the spacers 106 on the sidewalls of the patterned hard mask layer 104 includes: conformally forming a layer of spacer material on the patterned hard mask layer 104 and the target layer 102. Then, an anisotropic etch is performed to the spacer material layer to expose the top surface of the patterned hard mask layer 104 and the top surface of the target layer 102. Therefore the remaining spacer material layer forms the spacers 106.

Next, referring to FIG. 7, the hard mask layer 104 is removed. The remaining spacers 106 may serve as etch masks for etching the underlying target layer 102. First, the spacers 106 are formed with reference to FIGS. 6-7 described above, and then the spacers 106 are used to pattern the target layer by a self-aligned double patterning (SADP) process.

Figure 8:
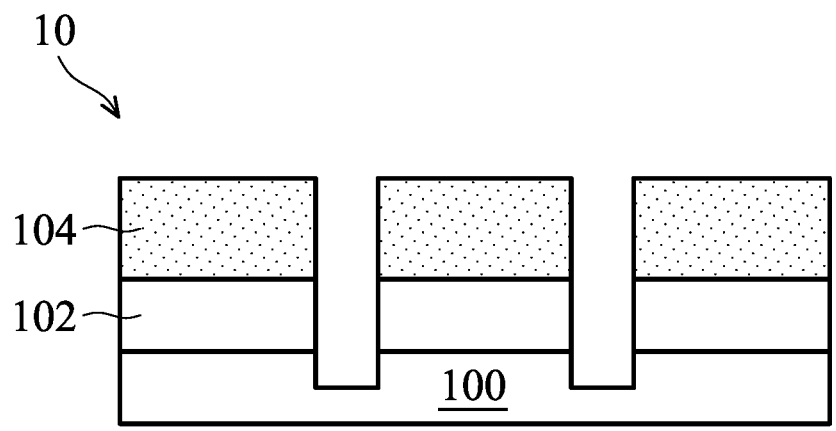

Referring to FIG. 8, in some embodiments, the hard mask layer 104 doped with group IV-A element may be used as a mask and/or a protective layer in a high aspect ratio etching process or a deep trench etching process to achieve desired aspect ratio. It should be noted that although the high aspect ratio etching process as shown in FIG. 8 etches the target layer 102 and the substrate 100, the high aspect ratio etching process may only etch the target layer 102 without etching the substrate 100.

Figure 9:
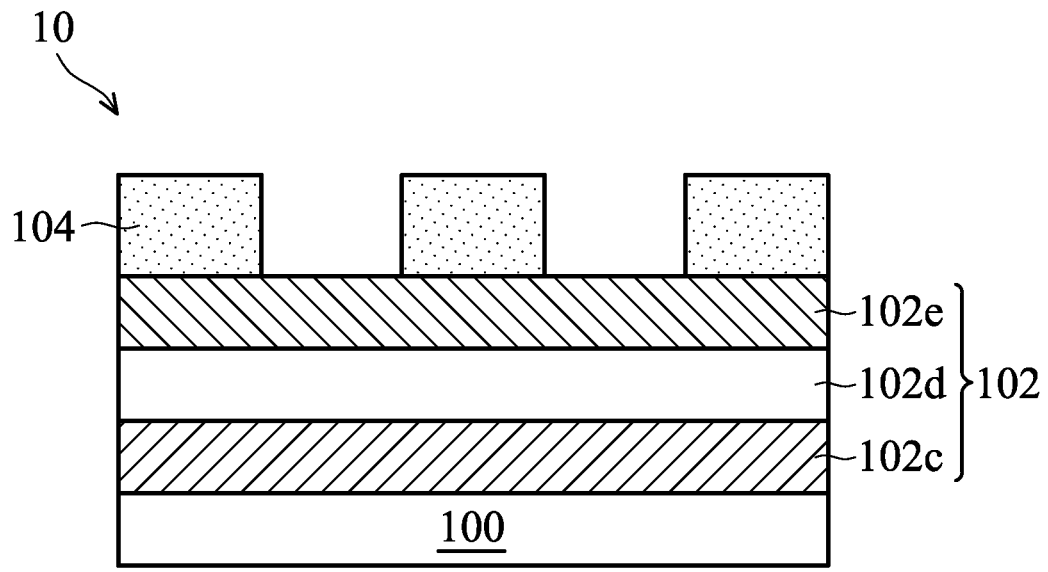
FIGS. 9, 10, 11, and 12 illustrate cross-sectional views of a semiconductor structure during manufacturing processes, according to another embodiment of the present disclosure.
Figure 10:
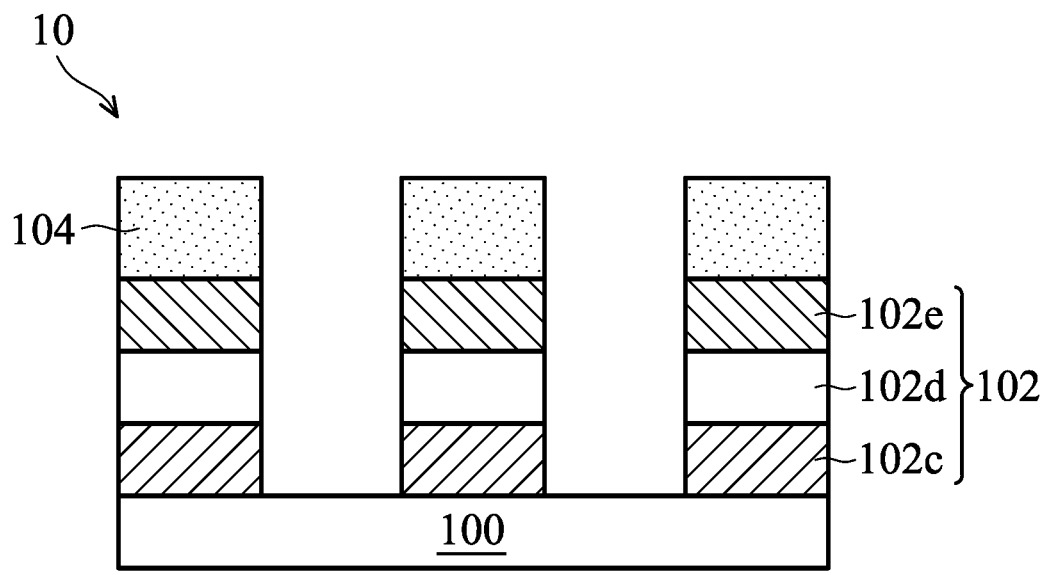

According to some embodiments, after forming the semiconductor structure 10 as shown in FIG. 3, a patterning process may be performed to form a plurality of gate stacks, as shown in FIGS. 9-10. Referring to FIGS. 3 and 9, the hard mask layer 104 is patterned to expose the control gate layer 102e. In some embodiments, patterning the hard mask layer 104 includes performing an etching process to the patterned hard mask layer 104. For example, in embodiments where the hard mask layer 104 is a DLC layer, the DLC layer may be etched by using a reactive ion etch process in which the process gas includes oxygen. Next, referring to FIG. 10, one or more etching processes are performed by using the hard mask layer 104 as a mask to remove the exposed control gate layer 102e, the inter-gate dielectric layer 102d, and the floating gate 102c. The remaining control gate layer 102e, the remaining inter-gate dielectric layer 102d, and the remaining floating gate layer 102c form a plurality of gate stacks 102. In addition, in other embodiments, the self-aligned double patterning process as shown in FIGS. 6-7 may be performed to the semiconductor structure 10 as shown in FIG. 3. A hard mask layer 104 doped with group IV-A element is used as a mandrel to form spacers on the control gate layer 102e, and the resulting spacers may be as a mask for controlling the etching of the control gate layer 102e, the inter-gate dielectric layer 102d, and the floating gate layer 102c.

Figure 11:
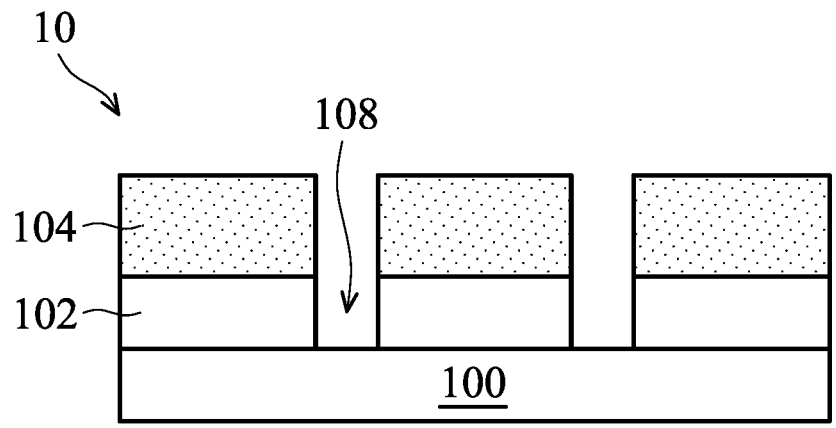
Figure 12:
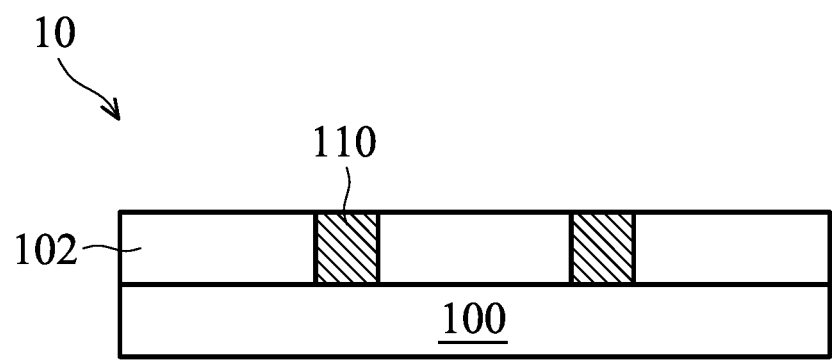

FIGS. 11-12 illustrate cross-sectional views of forming a semiconductor structure with conductive contact by a single damascene process according to other embodiments of the present disclosure. Referring to FIGS. 2 and 11, the hard mask layer 104 and the target layer 102 are patterned. For example, the hard mask layer 104 may be patterned using the process described above, and then the target layer 102 may be etched by using the hard mask layer 104 as a mask, wherein the target layer 102 is an inter-metal dielectric (IMD) layer (another material layer (not shown) may be formed under the target layer 102) to form an opening 108 exposing the substrate 100. Next, referring to FIG. 12, the hard mask layer 104 is removed, and then the conductive contact 110 are filled into the openings 108 by forming a material layer of the conductive contact in the openings 108, and then a planarization process is used to remove the material layer of the conductive contact outside the openings 108. Thereby, conductive contact 110 are formed in the opening 108.

The embodiments of the present disclosure provide a semiconductor structure having a hard mask layer doped with group IV-A element and a method of forming the same, which can avoid defects between layers and layers, thereby improving reliability and process margin of the semiconductor structure, and the performance of the resulting semiconductor device is improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   providing a substrate;
   forming a target layer on the substrate;
   forming a hard mask layer on the target layer; and
   implanting a group IV-A element into the hard mask layer to increase a number of sp2 orbital bonds in the hard mask layer, wherein a number of sp3 orbital bonds is greater than a number of sp2 orbital bonds of the group IV-A element doped in the hard mask layer.

2. The method for forming the semiconductor structure of claim 1, wherein after implanting the hard mask layer with the group IV-A element, a ratio of a number of sp3 orbital bonds to a number of sp2 orbital bonds in the hard mask layer is 2.5-4.0.

3. The method for forming the semiconductor structure of claim 1, wherein the hard mask layer comprises a diamond-like carbon (DLC) layer, and the group IV-A element is carbon.

4. The method for forming the semiconductor structure of claim 1, wherein implanting the hard mask layer with the group IV-A element is performed by an ex-situ implantation method.

5. The method for forming the semiconductor structure of claim 1, after implanting the hard mask layer with the group IV-A element, further comprising:
   patterning the hard mask layer to expose the target layer;
   forming a plurality of spacers on sidewalls of the patterned hard mask layer; and
   removing the hard mask layer.

6. The method for forming the semiconductor structure of claim 5, wherein patterning the hard mask layer to expose the target layer comprises an anisotropic etching process.

7. The method for forming the semiconductor structure of claim 6, wherein the anisotropic etching process etches the hard mask layer with an aspect ratio in the range of 1:1 to 1:200.

8. The method for forming the semiconductor structure of claim 1, further comprising:
   using the hard mask layer to pattern the target layer to form a gate stack, wherein the gate stack comprises a floating gate layer, a control gate layer over the floating gate layer, and an inter-gate dielectric layer between the floating gate layer and the control gate layer.

9. The method for forming the semiconductor structure of claim 1, further comprising:
   using the hard mask layer to pattern the target layer to form openings exposing the substrate;
   removing the hard mask layer; and
   forming a plurality of conductive contacts in the openings.

10. The method for forming the semiconductor structure of claim 1, wherein a compressive stress of the hard mask layer doped with the group IV-A element is −100 MPa to 100 MPa.

11. The method for forming the semiconductor structure of claim 1, wherein the hard mask layer comprises one or more layers of a group of SiGe, GeC, and SiC.

12. The method for forming the semiconductor structure of claim 1, wherein a doping concentration of the group IV-A element is $10^{10}$ cm$^{-3}$ to $10^{20}$ cm$^{-3}$.

13. The method for forming the semiconductor structure of claim 1, a compressive stress of the hard mask layer after implanting the group IV-A element is less than an absolute value of 10% of a compressive stress of the hard mask layer before implanting the group IV-A element.

14. The method for forming the semiconductor structure of claim 1, an etching resistance of the hard mask layer after implanting the group IV-A element is at least 85% of an etching resistance of the hard mask layer before implanting the group IV-A element.

15. The method for forming the semiconductor structure of claim 1, a thickness of the hard mask layer is in a range of 1 nm to 1 μm.

16. The method for forming the semiconductor structure of claim 1, an implantation energy of the group IV-A element is in a range of 100 eV to 10 MeV.

\* \* \* \* \*